(12) United States Patent
Shimura et al.

(10) Patent No.: US 9,992,915 B2
(45) Date of Patent: Jun. 5, 2018

(54) POWER CONVERSION DEVICE

(71) Applicant: Hitachi Automotive Systems, Ltd., Hitachinaka-shi, Ibaraki (JP)

(72) Inventors: Takahiro Shimura, Hitachinaka (JP); Akira Matsushita, Hitachinaka (JP); Shinichi Fujino, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 64 days.

(21) Appl. No.: 15/025,364

(22) PCT Filed: Oct. 1, 2014

(86) PCT No.: PCT/JP2014/076239
§ 371 (c)(1),
(2) Date: Mar. 28, 2016

(87) PCT Pub. No.: WO2015/053140
PCT Pub. Date: Apr. 16, 2015

(65) Prior Publication Data
US 2016/0234976 A1 Aug. 11, 2016

(30) Foreign Application Priority Data
Oct. 7, 2013 (JP) .................................. 2013-209797

(51) Int. Cl.
*H05K 7/20* (2006.01)
*H01L 23/473* (2006.01)
(Continued)

(52) U.S. Cl.
CPC ..... *H05K 7/20927* (2013.01); *H01L 23/3677* (2013.01); *H01L 23/4334* (2013.01);
(Continued)

(58) Field of Classification Search
CPC ... H05K 7/20927; H02M 7/003; H01L 23/46; H01L 25/18; H01L 23/4334; H01L 25/07;
(Continued)

(56) References Cited

U.S. PATENT DOCUMENTS 7,633,758 B2* 12/2009 Oohama ............... H01L 25/117
257/713
7,978,471 B2* 7/2011 Tokuyama .............. H01L 23/36
165/104.33
(Continued)

FOREIGN PATENT DOCUMENTS

JP 2006-202899 A 8/2006
JP 2008-259267 A 10/2008
(Continued)

OTHER PUBLICATIONS

International Search Report (PCT/ISA/210) issued in PCT Application No. PCT/JP2014/076239 dated Dec. 22, 2014 with English translation (6 pages).
(Continued)

Primary Examiner — Robert J Hoffberg
Assistant Examiner — Matt Dhillon
(74) Attorney, Agent, or Firm — Crowell & Moring LLP

(57) ABSTRACT

Size reduction of a power conversion device is intended. A power conversion device according to the present invention includes: a first power semiconductor module; a second semiconductor module; and a fixing member which fixes the first power semiconductor module, wherein the first power semiconductor module has a first power semiconductor device, a first case which houses the first power semiconductor device, and a first flange portion connected to the case, the second power semiconductor module has a second power semiconductor device, and a second case which houses the second power semiconductor device, the second
(Continued)

case is connected to the first flange portion so as to provide a first flow path space for allowing a coolant to flow between the second case and the first case, and the first flange portion is fixed to the fixing member while supporting the first case and the second power semiconductor module.

12 Claims, 18 Drawing Sheets

(51) Int. Cl.
    *H01L 23/367*     (2006.01)
    *H01L 23/433*     (2006.01)
    *H01L 25/07*     (2006.01)
    *H01L 25/18*     (2006.01)
    *H01L 23/46*     (2006.01)
    *H02M 7/00*     (2006.01)
    *H01L 23/31*     (2006.01)

(52) U.S. Cl.
    CPC ............ *H01L 23/46* (2013.01); *H01L 23/473* (2013.01); *H01L 25/07* (2013.01); *H01L 25/18* (2013.01); *H02M 7/003* (2013.01); *H01L 23/3107* (2013.01); *H01L 2224/48091* (2013.01); *H01L 2224/48247* (2013.01); *H01L 2924/13055* (2013.01); *H01L 2924/19107* (2013.01)

(58) Field of Classification Search
    CPC ............... H01L 23/3677; H01L 23/473; H01L 2924/13055; H01L 2224/48247; H01L 2924/19107; H01L 2224/48091; H01L 23/3107
See application file for complete search history.

(56) References Cited

U.S. PATENT DOCUMENTS

| | | | | |
|---|---|---|---|---|
| 8,659,130 | B2* | 2/2014 | Takagi | H01L 23/3675 |
| | | | | 257/675 |
| 9,179,581 | B2* | 11/2015 | Suwa | H05K 7/20927 |
| 9,350,228 | B2* | 5/2016 | Uetake | H02M 7/003 |
| 9,437,797 | B2* | 9/2016 | Matsumoto | H01L 23/3677 |
| 2008/0251909 | A1* | 10/2008 | Tokuyama | H01L 23/473 |
| | | | | 257/706 |
| 2011/0069455 | A1 | 3/2011 | Tokuyama et al. | |
| 2011/0299265 | A1 | 12/2011 | Nakatsu et al. | |
| 2011/0316143 | A1* | 12/2011 | Noritake | H01L 21/565 |
| | | | | 257/713 |
| 2013/0128646 | A1 | 5/2013 | Nishihara et al. | |
| 2013/0265808 | A1* | 10/2013 | Ishii | H02M 1/12 |
| | | | | 363/97 |
| 2014/0197532 | A1* | 7/2014 | Ide | H01L 23/36 |
| | | | | 257/706 |
| 2015/0016063 | A1* | 1/2015 | Higuma | H01L 23/473 |
| | | | | 361/714 |
| 2015/0214205 | A1* | 7/2015 | Tokuyama | H01L 24/40 |
| | | | | 257/139 |

FOREIGN PATENT DOCUMENTS

| | | |
|---|---|---|
| JP | 2010-110143 A | 5/2010 |
| JP | 2012-16095 A | 1/2012 |
| JP | 2012-029539 A | 2/2012 |

OTHER PUBLICATIONS

Japanese-language Written Opinion (PCT/ISA237) issued in PCT Application No. PCT/JP2014/076239 dated Dec. 22, 2014 (4 pages).

* cited by examiner

POWER CONVERSION DEVICE

TECHNICAL FIELD

The present invention relates to a power conversion device, and more particularly, a power conversion device for driving a vehicle.

BACKGROUND ART

A hybrid vehicle and an electric vehicle are mounted with a power conversion device including a plurality of inverters for driving a motor. The inverter converts direct current power supplied from a battery into alternating current power to drive the motor, and conversely convers alternating current power regenerated by the motor into direct current power and stores the power in a power storage apparatus. Each inverter includes a semiconductor module having a power semiconductor device and controls on-off operation of the power semiconductor device to drive the motor.

Since an amount of heat generated from the power semiconductor device by on-off operation is extremely large, the semiconductor module is required to have a structure with high cooling performance.

For meeting the requirement, for example, Patent Literature 1 discloses a method of improving cooling performance by dissipating heat generated due to on-off operation of a semiconductor device from both sides of a semiconductor module.

When a plurality of the semiconductor modules shown in Patent Literature 1 are mounted on a power conversion device, for obtaining excellent heat dissipation in each of the semiconductor modules, it is necessary to narrow down a sectional area of a water path by providing a water path wall so as to be adjacent to a heat dissipation portion, thereby making a large volume of cooling water flow to the heat dissipation portion of a heat dissipation case. The need of providing each semiconductor module with a water path wall and providing a space between the water path wall and the heat dissipation portion so as to prevent an interference therebetween involves a problem of an increase in size of the power conversion device.

Additionally, the semiconductor module has a flange portion for the fixing to a flow path-forming body or the like, and a space for connecting the flow path-forming body and the flange portion might prevent reduction in size of the power conversion device.

CITATION LIST

Patent Literature

PTL 1: Japanese Unexamined Patent Publication No. 2010-110143

SUMMARY OF INVENTION

Technical Problem

Thus, an object of the present invention is to reduce a power conversion device in size. An additional object of the present invention is to improve cooling performance of the power conversion device.

Solution to Problem

A power conversion device according to the present invention includes: a first power semiconductor module; a second power semiconductor module; and a fixing member which fixes the first power semiconductor module, wherein the first power semiconductor module has a first power semiconductor device, a first case which houses the first power semiconductor device, and a first flange portion connected to the case, the second power semiconductor module has a second power semiconductor device, and a second case which houses the second power semiconductor device, the second case is connected to the first flange portion so as to provide a first flow path space for allowing a coolant to flow between the second case and the first case, and the first flange portion is fixed to the fixing member while supporting the first case and the second power semiconductor module.

Advantageous Effects of Invention

The present invention enables size reduction of a power conversion device.

DESCRIPTION OF EMBODIMENTS

In the following, embodiments of a power conversion device according to the present invention will be described with reference to the drawings.

Figure 1:
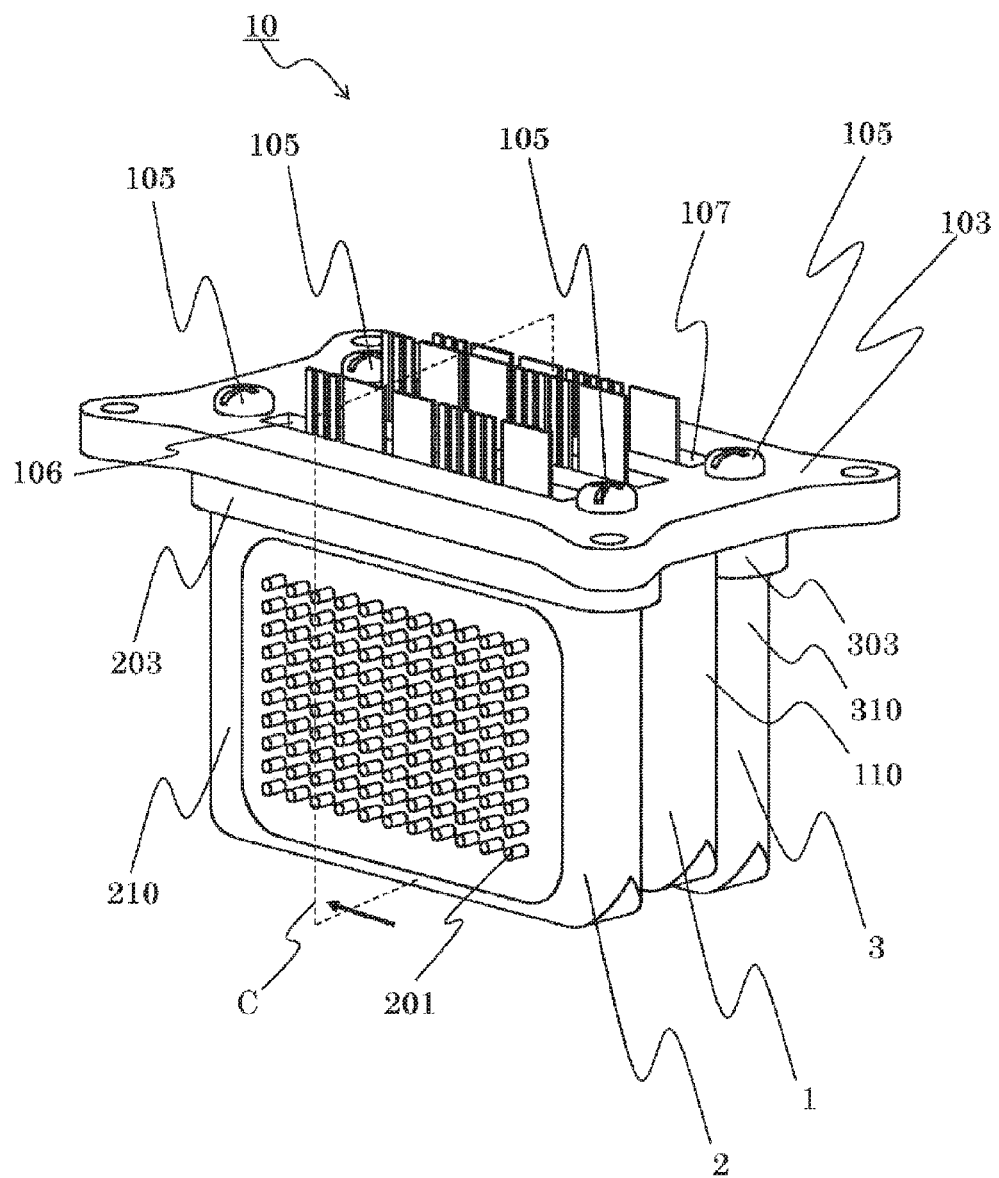
FIG. 1 is an external perspective view of an assembly 10 including a plurality of power semiconductor modules assembled according to a present embodiment.
Figure 2:
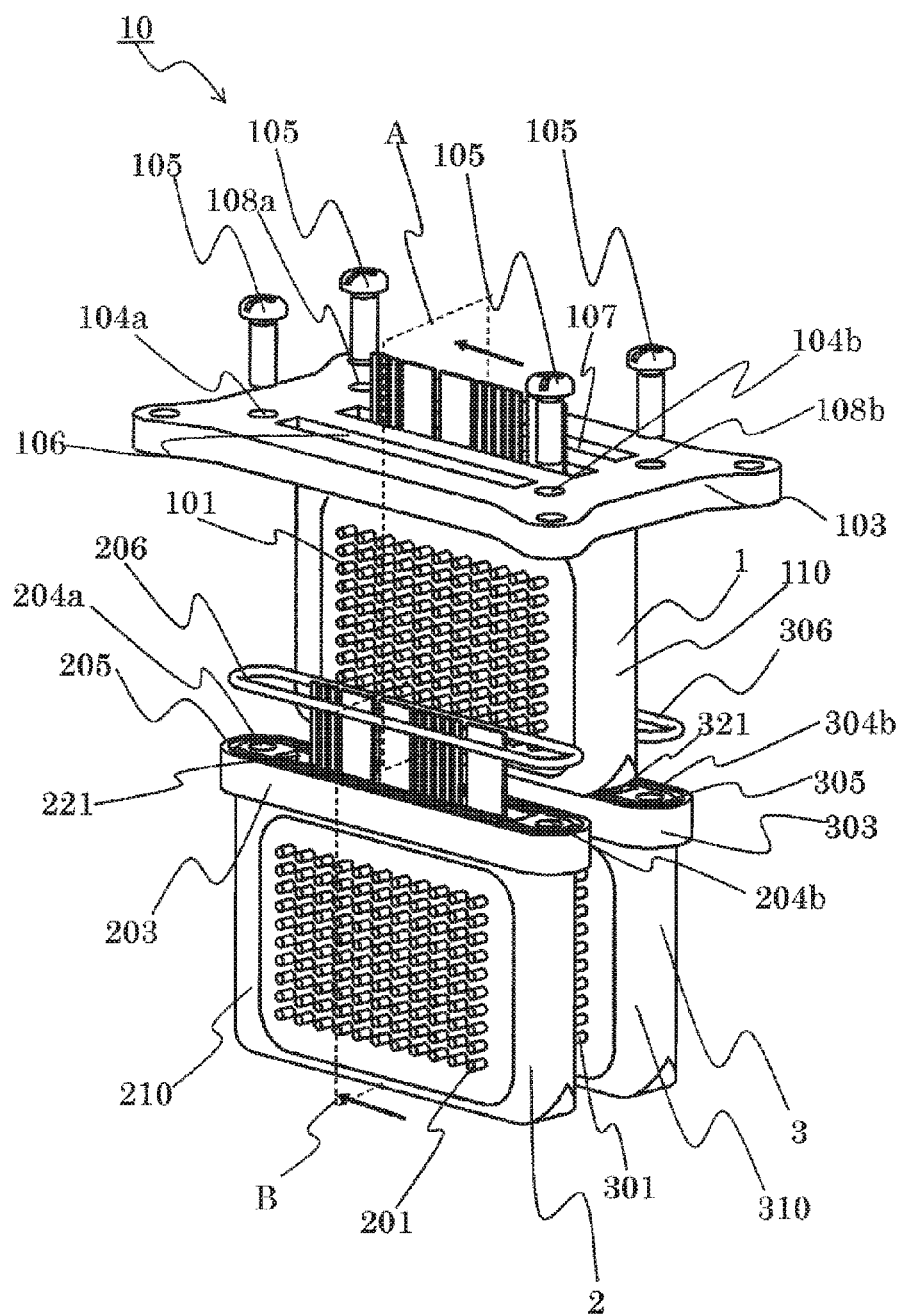
FIG. 2 is an exploded perspective view showing the exploded assembly 10.

FIG. 1 is an external perspective view of an assembly 10 including a plurality of power semiconductor modules assembled according to the present embodiment. FIG. 2 is an exploded perspective view showing the exploded assembly 10.

A first power semiconductor module 1 has a first case 110 that houses a semiconductor unit 400 which will be described later. The first case 110 forms an opening portion (not shown) through which a terminal extending from a semiconductor unit 400 passes. A first flange portion 103 is formed so as to surround the opening portion of the first case 110.

A second power semiconductor module 2 has a second case 210 which houses the semiconductor unit 400. The second case 210 forms an opening portion 221 through which the terminal extending from the semiconductor unit 400 passes. A second flange portion 203 is formed so as to surround the opening portion 221.

A third power semiconductor module 3 has a third case 310 which houses the semiconductor unit 400. The third case 310 forms an opening portion 321 through which the terminal extending from the semiconductor unit 400 passes. A third flange portion 303 is formed so as to surround the opening portion 321. A through hole 106 is formed at a region of the first flange portion 103 opposed to the opening portion 221 of the second power semiconductor module 2. A through hole 107 is formed at a region of the first flange portion 103 opposed to the opening portion 321 of the third power semiconductor module 3. Further, a through hole 104a is formed at one side in a shorter side direction of the through hole 106 and a through hole 104b is formed at the other side in the shorter side direction of the through hole 106. A through hole 108a is formed at one side in a shorter side direction of the through hole 107 and a through hole 108b is formed at the other side in the shorter side direction of the through hole 107.

The second case 210 is formed with a connection portion 204a and a connection portion 204b to be connected with a fixture 105 such as a screw. The connection portion 204a is formed at one side in a shorter side direction of the opening portion 221 and the connection portion 204b is formed at the other side in the shorter side direction of the opening portion 221. When seen from a direction perpendicular to an aperture of the opening portion 221, a groove 205 is formed so as to surround the opening portion 221, and the connection portion 204a and the connection portion 204b. A sealing member 206 is fit in the groove 205.

Similarly, the third case 310 is formed with a connection portion 304a (not shown) and a connection portion 304b to be connected with the fixture 105. The connection portion 304a is formed at one side in a shorter side direction of the opening portion 321 and the connection portion 304b is formed at the other side in the shorter side direction of the opening portion 321. When seen from a direction perpendicular to an aperture of the opening portion 321, a groove 305 is formed so as to surround the opening portion 321, and the connection portion 304a and the connection portion 304b. A sealing member 306 is fit in the groove 305.

The second case 210 is connected to the first flange portion 103 by the connection of the fixture 105 with the connection portion 204a and the connection portion 204b. Similarly, the third case 310 is connected to the first flange portion 103 by the connection of the fixture 105 with the connection portion 304a and the connection portion 304b. The third case 310 is arranged at a position opposed to the second case 210 with the first case 110 provided therebetween.

The first case 110 has a fin 101 on a surface thereof formed facing the second case 210 and a fin 102 (see FIG. 3) on a surface thereof formed facing the third case 310. The second case 210 has a fin 202 (see FIG. 4) on a surface thereof formed facing the first case 110 and a fin 201 on a surface thereof opposite to the surface on which the first case 110 is arranged. Similarly, the third case 310 has a fin 301 on a surface thereof formed facing the first case 110 and a fin 302 (see FIG. 5) on a surface thereof opposite to the surface on which the first case 110 is arranged.

Figure 3:
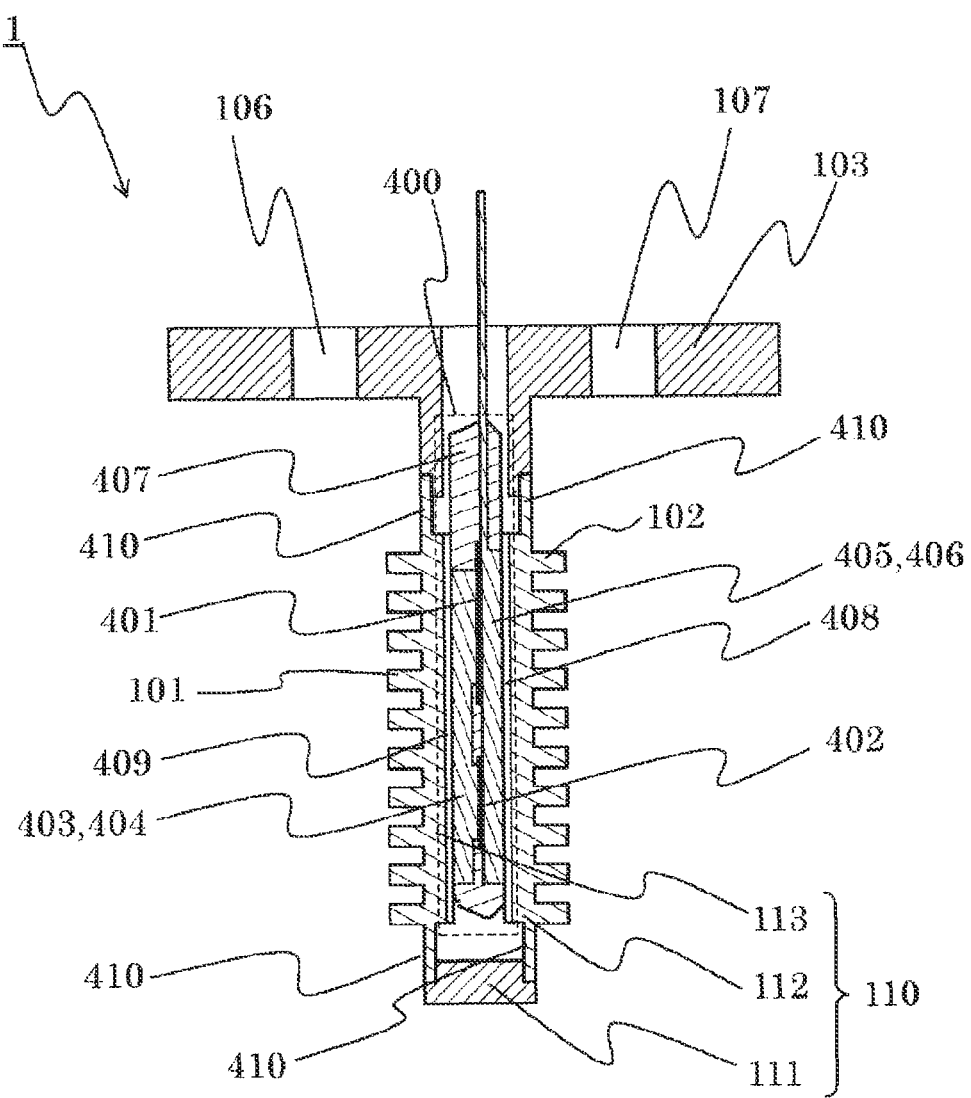
FIG. 3 is a sectional view of a first power semiconductor module 1 taken along a plane A and seen from a direction of an arrow shown in FIG. 2.

FIG. 3 is a sectional view of the first power semiconductor module 1 taken along a plane A and seen from a direction of an arrow shown in FIG. 2.

The semiconductor unit 400 has semiconductor devices such as an IGBT 401 and a diode 402, conductor portions 403 to 406 connected to the IGBT 401 and the diode 402 via a soldering material, and a sealing resin 407 which seals the semiconductor devices and the conductor portions. A detailed structure of the semiconductor unit 400 will be described with reference to FIGS. 8 to 12.

The first case 110 is configured with a frame body 111, a fin base portion 112 and a fin base portion 113. The frame body 111 forms two opening portions opposed to each other. The fin base portion 112 blocks one opening portion of the frame body 111. The fin base portion 113 blocks the other opening portion of the frame body 111.

The semiconductor unit 400 is arranged in a space between the fin base portion 112 and the fin base portion 113. Further, one surface of the semiconductor unit 400 is thermally connected to the fin base portion 112 via an insulation member 408. The other surface of the semiconductor unit 400 is thermally connected to the fin base portion 113 via an insulation member 409. The insulation members 408 and 409 are highly thermal conductive insulating layers, for which an insulating sheet or a thermal spraying film is used.

In the present embodiment, in order to increase a thermal conductivity, the fin base portion 112 is integrally formed with the fin 102 and the fin base portion 113 is integrally formed with the fin 101. Additionally, the fin base portion 112 and the fin base portion 113 are made of aluminum such as A1050 having excellent thermal conductivity.

Additionally, the fin base portion 112 and the fin base portion 113 are each configured with a fin-forming portion in which the fin 101 and the fin 102 are formed, and an outer circumference portion 410 which surrounds the fin-forming portion. Then, the outer circumference portion 410 is formed to be thinner than the fin-forming portion. The thinly formed outer circumference portion 410 adjusts a position of the fin-forming portion to fix the semiconductor unit 400.

In order to increase a strength, the frame body 111 is formed of aluminum or the like having rigidity higher than that of the fin base portion 112 and the fin base portion 113. The first flange portion 103 is formed to be perpendicular to a fin-forming surface of the fin base portion 112.

Figure 4:
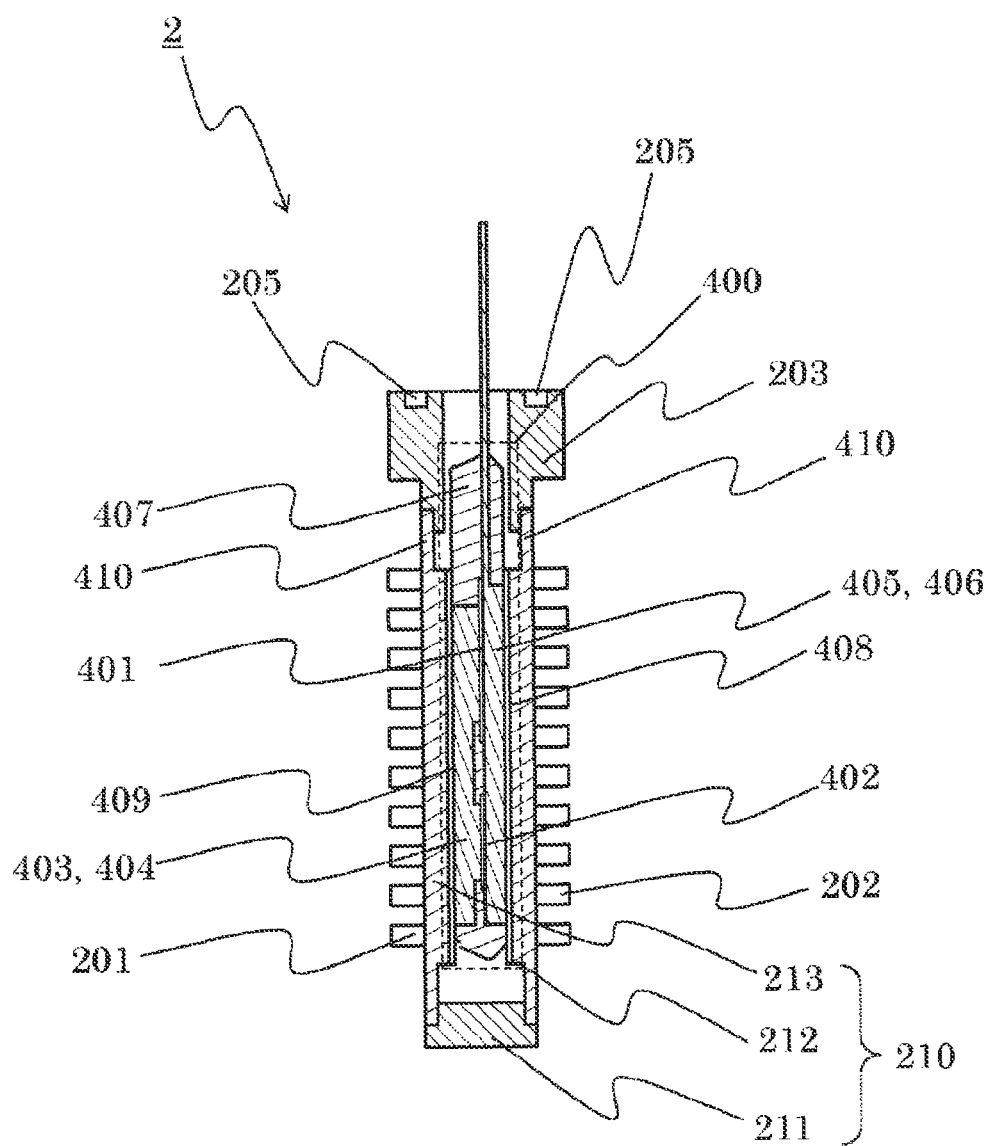
FIG. 4 is a sectional view of a second power semiconductor module 2 taken along a plane B and seen from a direction of an arrow shown in FIG. 2.

FIG. 4 is a sectional view of the second power semiconductor module 2 taken along a plane B and seen from a direction of an arrow shown in FIG. 2.

Since the semiconductor unit 400 has the same structure and functions of the semiconductor unit described with reference to FIG. 3, no description will be made thereof.

The second case 210 is configured with a frame body 211, a fin base portion 212 and a fin base portion 213. The frame body 211 forms two opening portions opposed to each other. The fin base portion 212 blocks one opening portion of the frame body 211. The fin base portion 213 blocks the other opening portion of the frame body 211.

The semiconductor unit 400 is arranged in a space between the fin base portion 212 and the fin base portion 213. Further, one surface of the semiconductor unit 400 is thermally connected to the fin base portion 212 via the insulation member 408. The other surface of the semiconductor unit 400 is thermally connected to the fin base portion 213 via the insulation member 409.

In the present embodiment, in order to increase a thermal conductivity, the fin base portion 212 is integrally formed with the fin 202 and the fin base portion 213 is integrally formed with the fin 201. Additionally, the fin base portion 212 and the fin base portion 213 are made of aluminum such as A1050 having excellent thermal conductivity.

Additionally, the fin base portion 212 and the fin base portion 213 are each configured with a fin-forming portion in which the fin 201 and the fin 202 are formed, and the outer circumference portion 410 which surrounds the fin-forming portion. Then, the outer circumference portion 410 is formed to be thinner than the fin-forming portion. The thinly formed outer circumference portion 410 adjusts a position of the fin-forming portion to fix the semiconductor unit 400.

In order to increase a strength, the frame body 211 is formed of aluminum or the like having rigidity higher than that of the fin base portion 212 and the fin base portion 213. The second flange portion 203 is formed to be perpendicular to a fin-forming surface of the fin base portion 212.

Since the third case 310 has the same structure and functions of the second case 210, no description will be made thereof.

Figure 5:
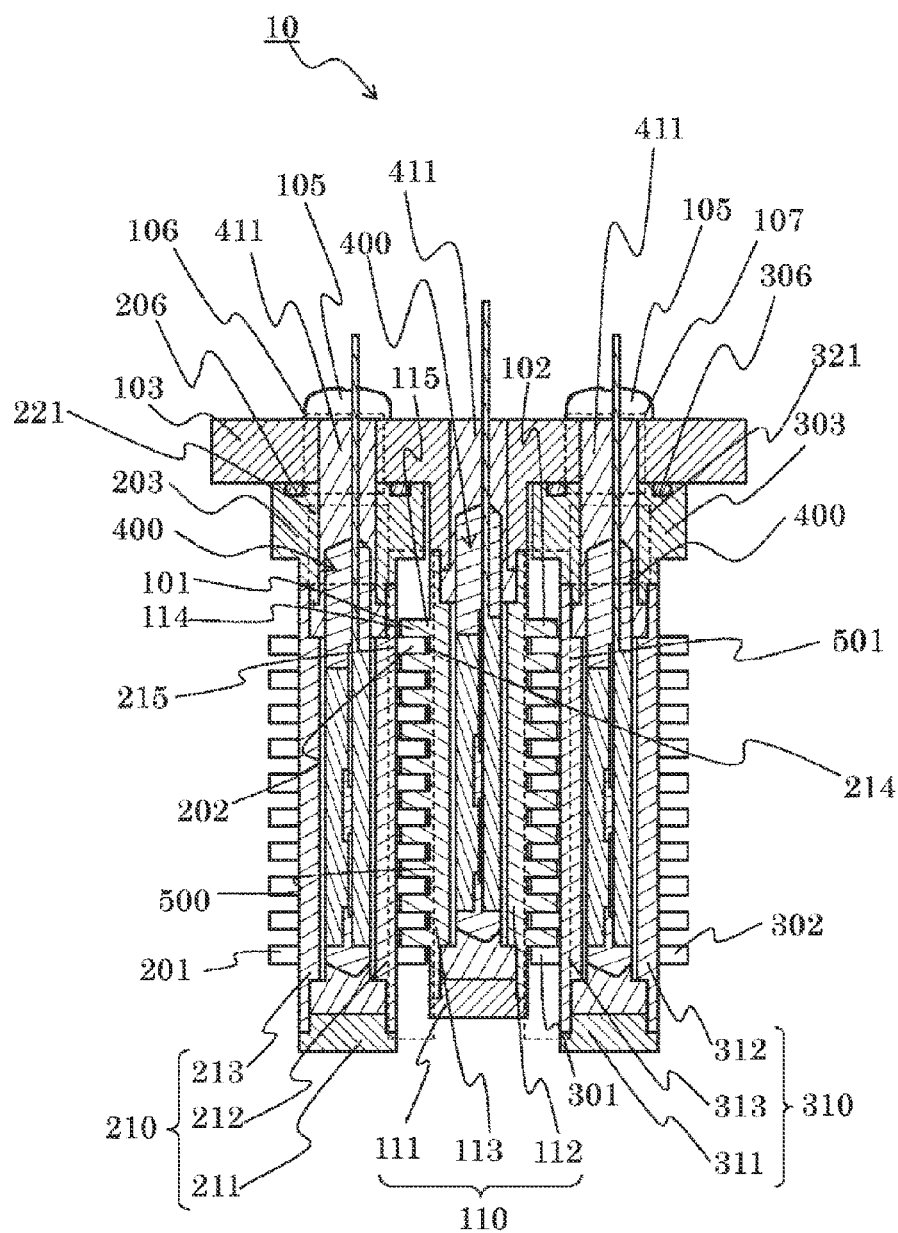
FIG. 5 is a sectional view of the assembly 10 taken along a plane C and seen from a direction of an arrow shown in FIG. 1.

FIG. 5 is a sectional view of the assembly 10 taken along a plane C and seen from a direction of an arrow shown in FIG. 1.

The second case 210 is connected to the first flange 103 so as to form a flow path space 500 between the second case 210 and the first case 110 for making a coolant flow. A flow velocity of the coolant flowing through the flow path space 500 changes with a sectional area of the flow path space 500 vertical to a flowing direction of the coolant (a direction perpendicular to a paper face of FIG. 5). As a result, cooling performance of the first case 110 and the second case 210 changes.

On the other hand, when improving cooling performance by increasing a flow velocity of the coolant through reduction in a vertical sectional area of the flow path space 500, the first flange portion 103 of the first case 110 and the second flange portion 203 of the second case 210 interfere with each other, so that adjustment of the flow velocity of the coolant might be difficult. In other words, when the first case 110 and the second case 210 are individually fixed to the respective fixing members (not shown in FIG. 5), a sealing structure portion between the first case 110 and the fixing member and a sealing structure portion between the second case 210 and the fixing member will be respectively provided above the flow path space 500.

Thus, the second case 210 is formed to be fixed to the first flange portion 103 of the first case 110, and the first flange portion 103 is fixed to the fixing member while supporting the first case 110 and the second case 210 as in the present embodiment. This reduces the sealing structure portion above the flow path space 500 to facilitate improvement in cooling performance through adjustment of the vertical sectional area of the flow path space 500. Additionally, size reduction of the assembly 10 itself contributes to reduction in size of the entire power conversion device.

The above-described functions and effects are also the case with the third case 310. The third case 310 is connected to the first flange 103 so as to form a flow path space 501 between the third case 310 and the first case 110 for making a coolant flow. As a result, the third case 310 is arranged to be opposed to the second case 210 with the first case 110 provided therebetween, so that both surfaces of the first case 110, the surface on the side of the second case 210 and the surface on the side of the third case 310, can be efficiently cooled, while size reduction of the power conversion device as a whole can be enhanced.

While in the present embodiment, the three of the first case 110, the second case 210 and the third case 310 are used, even with the two of the first case 110 and the second case 210, the same functions and effects can be obtained.

In the present embodiment, when the second case 210 and the third case 310 are arranged on the first flange portion 103, using the sealing members 206 and 306 formed of an elastic member and crushing the same makes the first flange portion 103 have watertightness. On the other hand, without using the sealing members 206 and 306 formed of an elastic member, the second case 210 and the third case 310 may be bonded to the first flange portion 103 by welding or the like.

Additionally, with the semiconductor units 400 respectively inserted in the first case 110, the second case 210 and the third case 310, an insulating resin material 411 is filled in each case. Further, the insulating resin material 411 is arranged also in the through hole 106 and the through hole 107 of the first flange 103. Specifically, the insulating resin material 411 is arranged between an internal wall of each of the through hole 106 and the through hole 107 and a terminal. This prevents a terminal extending from the second case 210 and a terminal extending from the third case 310 from coming into contact with the first flange 103, thereby increasing insulation reliability and prevent damage caused at the time of assembly.

While in the present embodiment, the first case 110 is formed of other member than those of the insulating resin material 411 and the sealing resin 407, these may be integrally formed of a resin material or the like as the first case 110. For example, the frame body 111 and the insulating resin material 411 may be integrally formed of a resin material, and the fin base portion 112 and the fin base portion 113 may be formed of metal. This is also the case with the second case 210 and the third case 310.

Additionally, the fin 101 is formed to have its distal end portion 114 located closer to the fin base portion 212 than a connection portion 115 between the fin 101 and the fin base portion 113 in the flow path space 500. Further, the fin 201 is formed to have its distal end portion 214 located closer to the fin base portion 113 than a connection portion 215 between the fin 201 and the fin base portion 212 in the flow path space 500. This enables improvement in cooling performance of the first case 110 and the second case 210, while enhancing size reduction. The fin 102 and the fin 302 in the flow path space 501 have the same relationship, functions and effects.

Figure 6:
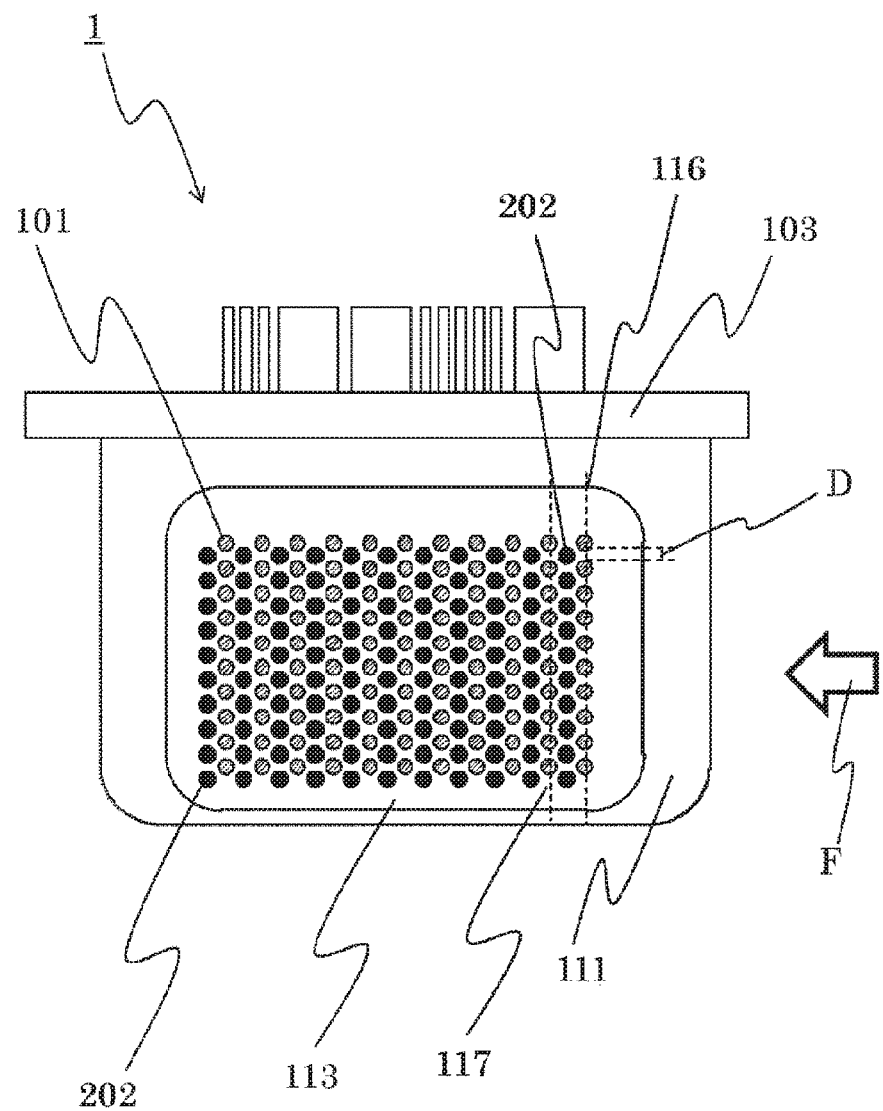
FIG. 6 is a side view of the first power semiconductor module 1 with only a fin 202 of the second power semiconductor module 2 remaining.
Figure 7:
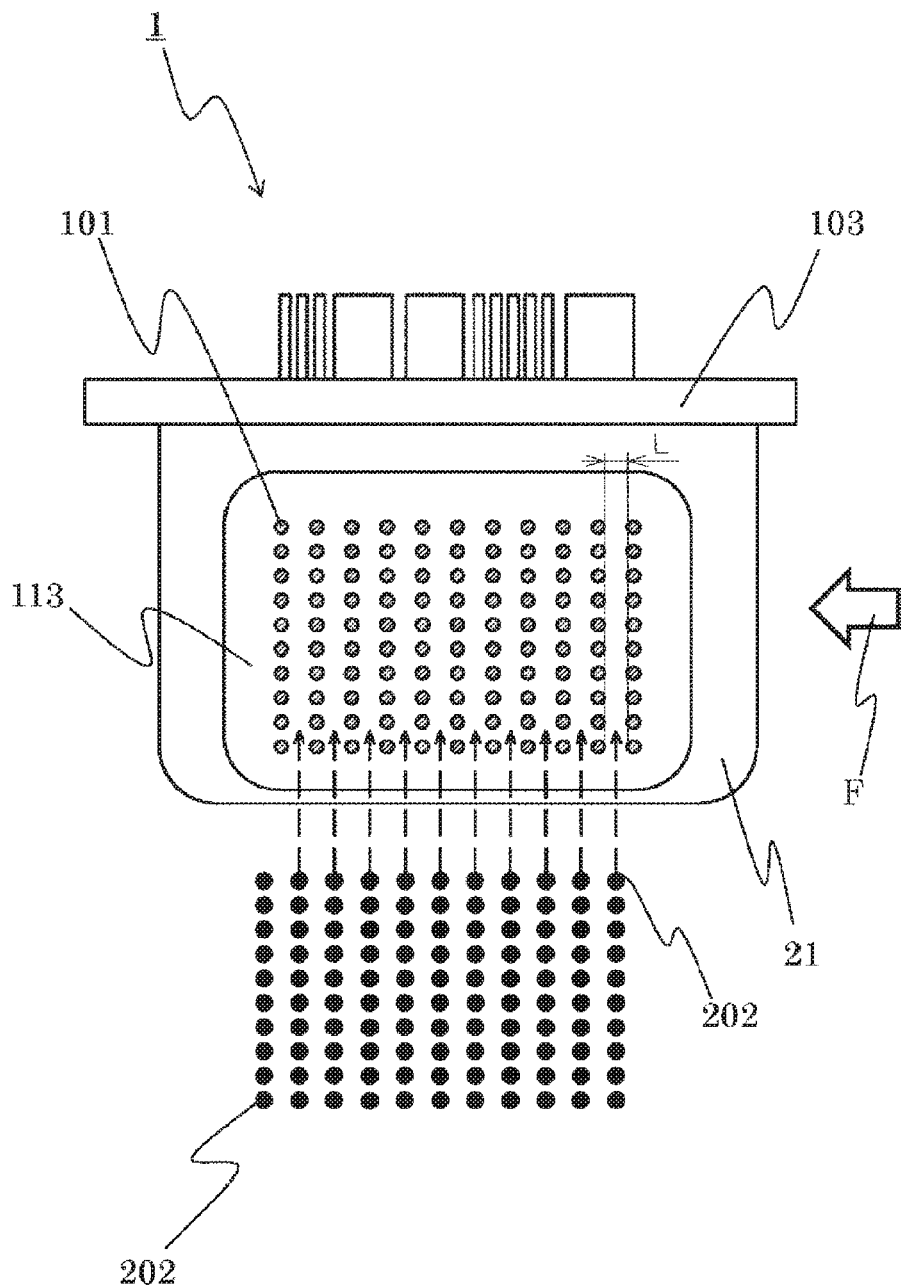
FIG. 7 is a side view of the first power semiconductor module 1 with only the fin 202 of the second power semiconductor module 2 remaining when the second power semiconductor module 2 is assembled.

FIG. 6 is a side view of the first power semiconductor module 1 with only the fin 202 of the second power semiconductor module 2 remaining. The fin 101 shown as a hatched part is a fin of the first power semiconductor module 1 and the filled-in fin 202 is a fin of the second power semiconductor module 2. FIG. 7 is a side view of the first power semiconductor module 1 with only the fin 202 of the second power semiconductor module 2 remaining when the second power semiconductor module 2 is assembled.

An arrow F indicates a coolant flowing direction. The fin 101 is configured to include a first line fin group 116 aligned in a direction traversing the coolant flowing direction F. Then, the fin 202 is formed to have a width opposed to the coolant flowing direction F larger than a distance D between adjacent fins forming the first line fin group 116. Further, when projected from the coolant flowing direction F, the fin 202 is arranged such that a projected part of the fin 202 overlaps a space between the adjacent fins forming the first line fin group 116 (see FIG. 5). This makes the coolant flowing between the fin 101 and the fin 202 flow efficiently in the coolant flowing direction, thereby improving cooling performance. The fin 102 and the fin 301 in the flow path space 501 have the same relationship, functions and effects.

Additionally, the fin 101 is configured to include a second line fin group 117 aligned in a direction traversing the coolant flowing direction F. Then, the second line fin group 117 is arranged such that a distance L between the second line fin group 117 and the first line fin group 116 in the coolant flowing direction F is larger than a width of the fin 202 along the coolant flowing direction F. As a result, in a case where an insertion direction of the second case 210 for the connection to the first flange portion 103 traverses the coolant flowing direction F, interference between the fin 101 and the fin 202 can be prevented at the time of positioning of the connection portion or fixing operation by the fixture 105, thereby improving productivity while maintaining cooling performance.

Figure 8:
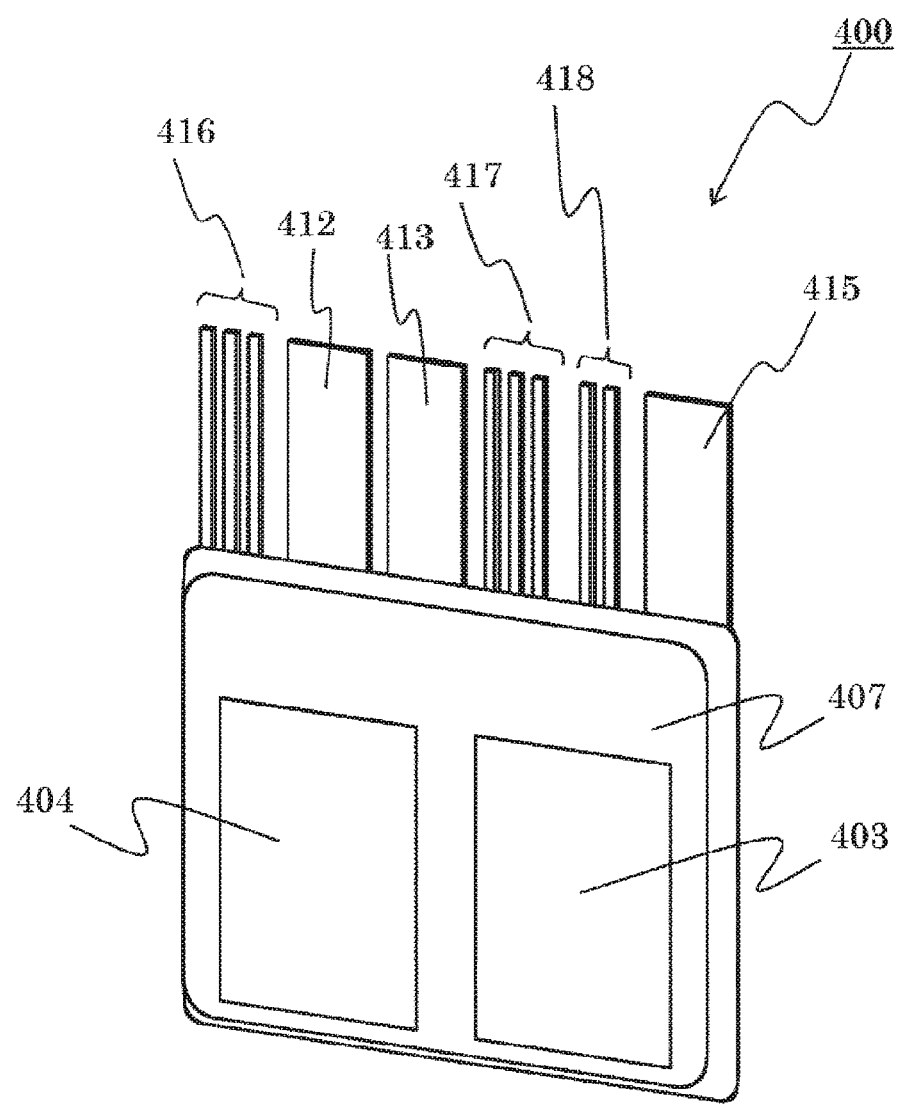
FIG. 8 is an external perspective view of one side surface of a semiconductor unit 400 according to the present embodiment.
Figure 9:
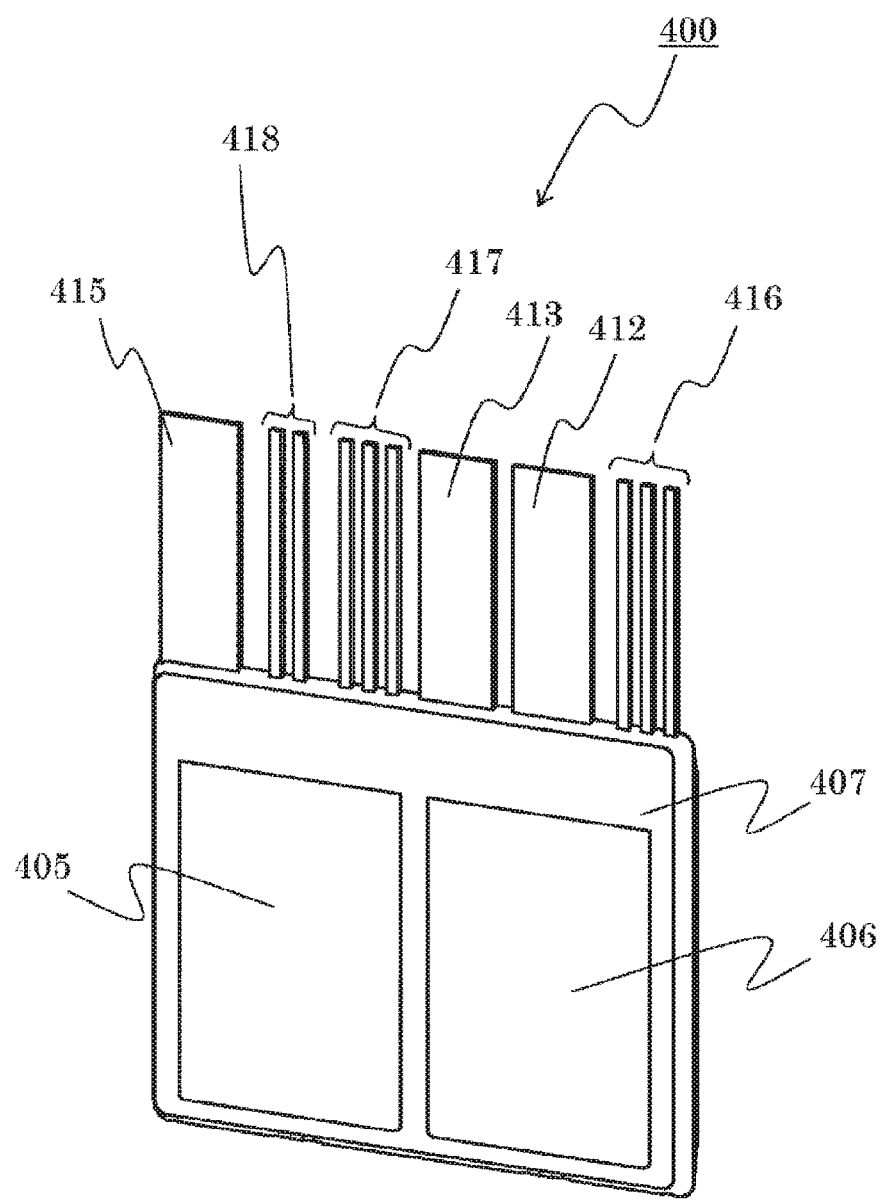
FIG. 9 is an external perspective view of the other side surface of the semiconductor unit 400.
Figure 10:
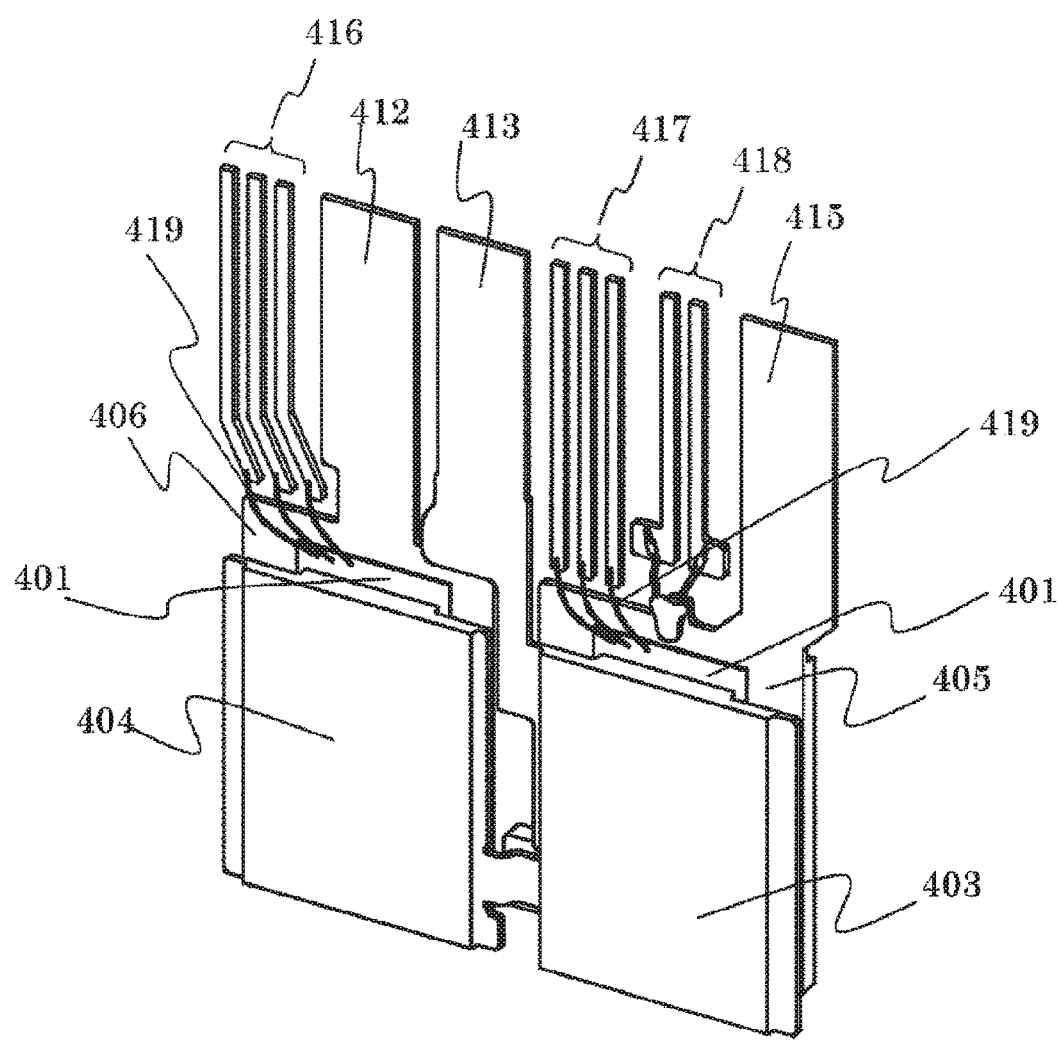
FIG. 10 is an external perspective view of the semiconductor unit 400 with a sealing resin 407 removed.
Figure 11:
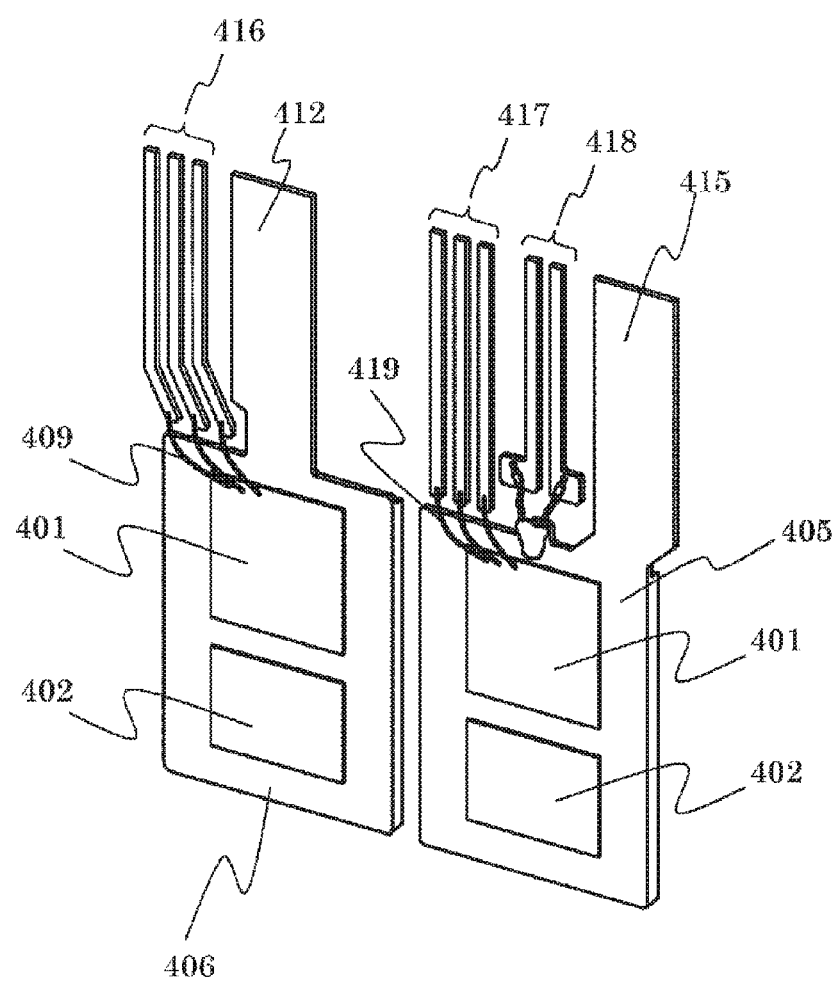
FIG. 11 is an external perspective view of the unit shown in FIG. 10 from which a conductor portion 404 and a conductor portion 403 are removed.

FIG. 8 is an external perspective view of one side surface of the semiconductor unit 400 according to the present embodiment. FIG. 9 is an external perspective view of the other side surface of the semiconductor unit 400. FIG. 10 is an external perspective view of the semiconductor unit 400 with the sealing resin 407 removed. FIG. 11 is an external perspective view of the unit shown in FIG. 10 from which the conductor portion 404 and the conductor portion 403 are removed.

As illustrated in FIG. 10, the conductor portion 403 and the conductor portion 404 are arranged such that their main surfaces overlap with each other on the same virtual plane. The conductor portion 405 and the conductor portion 406 are arranged such that their main surfaces overlap with each other on the same virtual plane. As illustrated in FIG. 8, a part of each main surface of the conductor portion 403 and the conductor portion 404 is exposed from the sealing resin 407 to form a heat dissipation surface. Similarly, as illustrated in FIG. 9, a part of each main surface of the conductor portion 405 and the conductor portion 406 is exposed from the sealing resin 407 to form the heat dissipation surface.

A direct-current positive electrode terminal 412 is connected to the conductor portion 406 and protrudes from the sealing resin 407. A direct-current negative electrode terminal 413 is connected to the conductor portion 403 and protrudes from the sealing resin 407. An alternating-current terminal 415 is connected to the conductor portion 405 and protrudes from the sealing resin 407. An upper arm side gate terminal 416 is connected to a gate electrode of the IGBT 401 forming an upper arm circuit via a bonding wire 419. A lower arm side gate terminal 417 is connected to a gate electrode of the IGBT 401 forming a lower arm circuit via the bonding wire 419. A temperature signal terminal 418 is connected to a temperature element via the bonding wire 419.

The IGBT 401 and the diode 402 are bonded to the conductor portions 403 to 406, respectively, via a metal bonding material. Used as a metal bonding material are, for example, a soldering material, a silver sheet, and a low-temperature sintering bonding material including fine metallic particles.

The sealing resin 407 is provided for the purpose of improving reliability and holding the conductor portions 403 to 406. The sealing resin 407 is formed, for example, by transfer molding using an epoxy resin.

Figure 12:
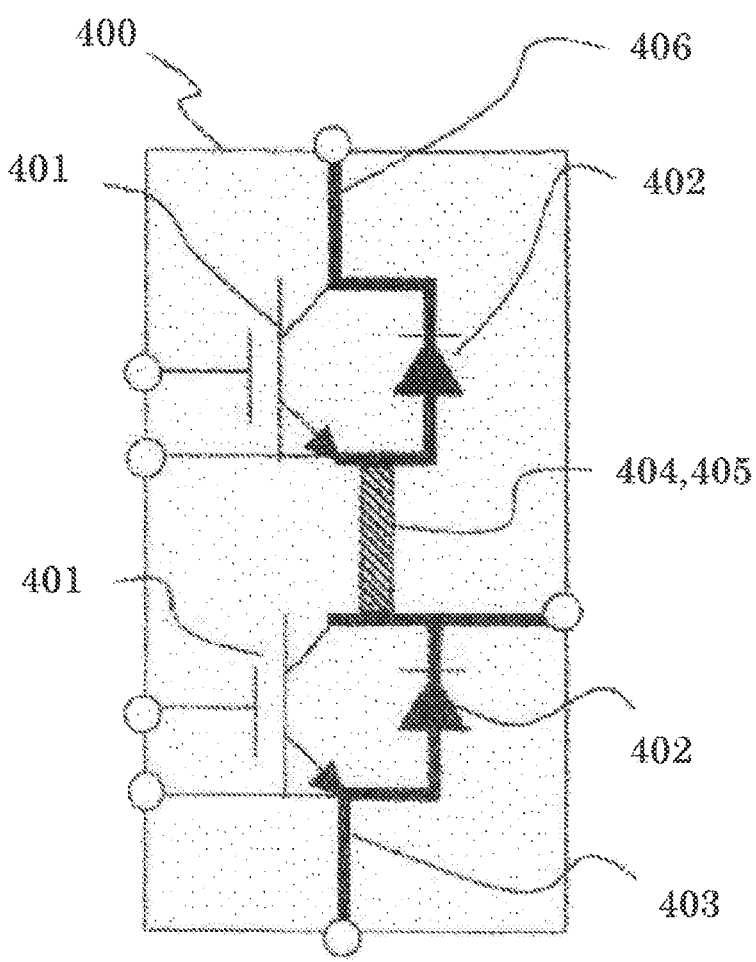
FIG. 12 is a circuit diagram showing one example of a circuit configuration contained in the semiconductor unit 400 according to the present embodiment.

FIG. 12 is a circuit diagram showing one example of a circuit configuration contained in the semiconductor unit 400 according to the present embodiment. The circuit illustrated in FIG. 12 shows a circuit configuration of one phase of an inverter circuit.

As a semiconductor device of the semiconductor unit 400, a power transistor including an IBGT (insulated gate bipolar transistor) is used.

To the conductor portion 405, a collector electrode of the IGBT 401 on the upper arm side and a cathode electrode of the diode 402 on the upper arm side are connected. To the conductor plate 404, a collector electrode of the IGBT 401 on the lower arm side and a cathode electrode of the diode 402 on the lower arm side are connected. Providing thus configured semiconductor unit 400 with U-phase, V-phase and W-phase to form one inverter circuit results in the assembly 10 illustrated in FIG. 1. Since a power conversion device 100 according to the present embodiment, which is mounted with such assembly 10, can be reduced in size and has excellent cooling performance, the device can be used for a vehicle driving electric machine system of a vehicle-mounted electric machine system which is mounted on an electric vehicle or a hybrid vehicle. Under a condition similar to that for use of vehicles, the power conversion device 100 according to the present embodiment is usefully applied.

Figure 13:
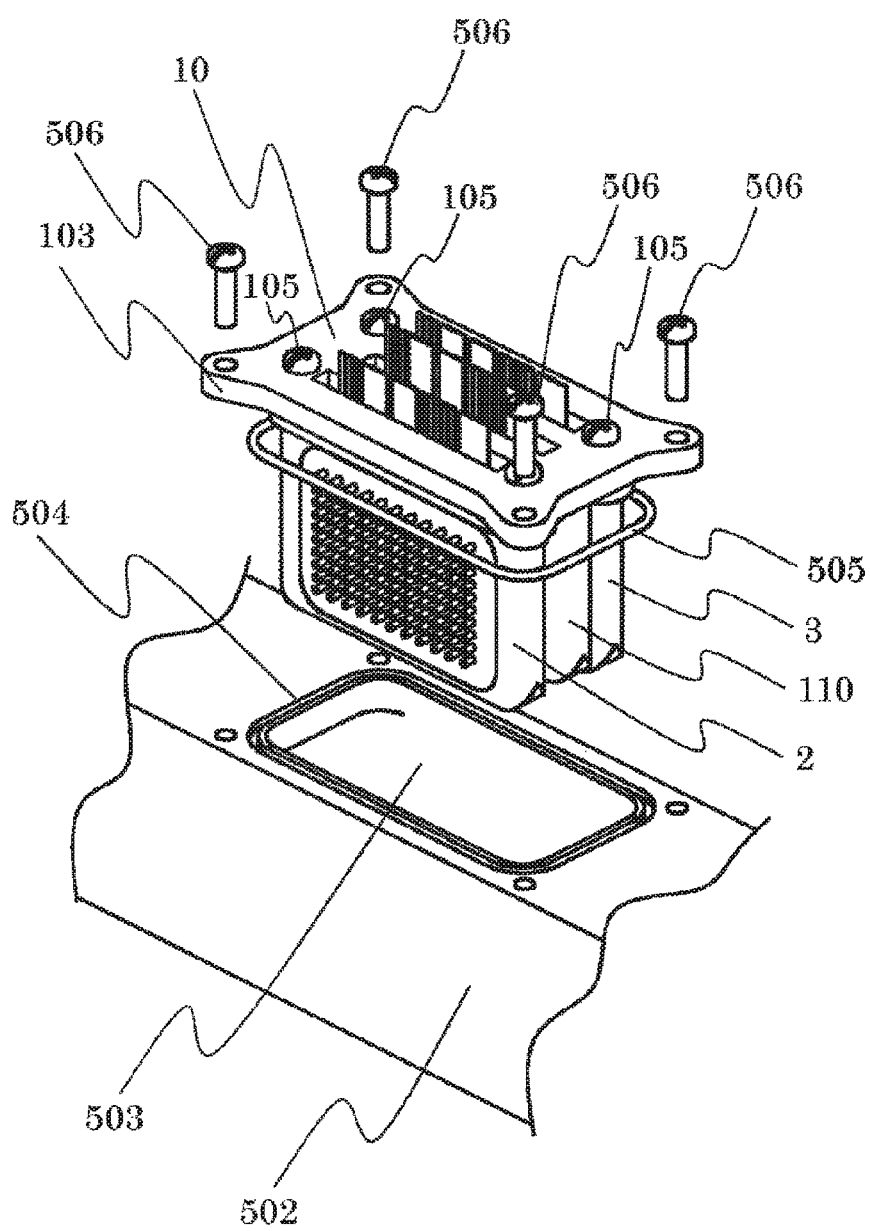
FIG. 13 is an external perspective view showing a step of assembling the assembly 10 into a flow path-forming body 502.
Figure 14:
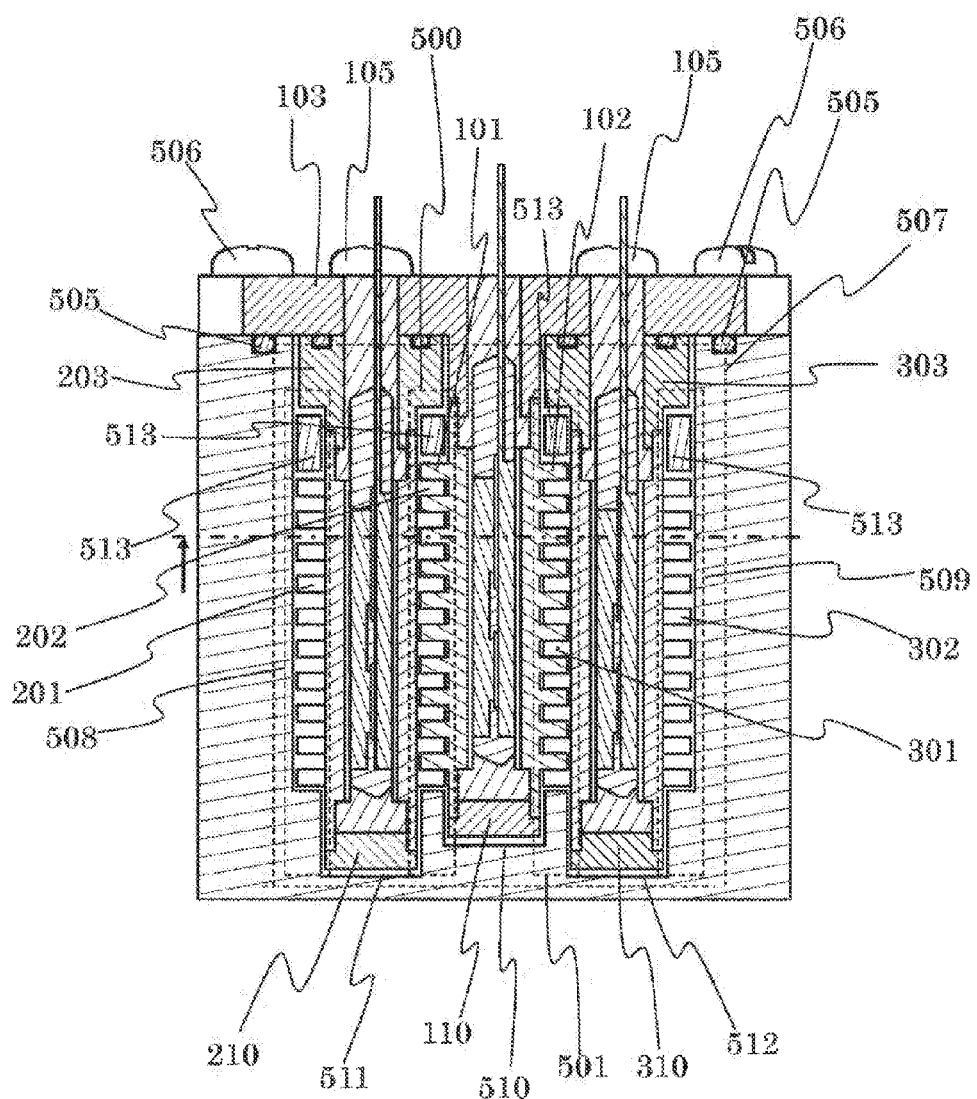
FIG. 14 is a sectional view of the assembly 10 assembled into the flow path-forming body 502.

FIG. 13 is an external perspective view showing a step of assembling the assembly 10 into a flow path-forming body 502. FIG. 14 is a sectional view of the assembly 10 assembled into the flow path-forming body 502.

The flow path-forming body 502 forms a flow path 507 for allowing a coolant mostly as a liquid to flow, and an opening 503 connecting to the flow path 507. A groove 504 is formed to surround the opening 503, in which groove 504 a sealing member 505 is fit.

The assembly 10 is fixed to the flow path-forming body 502 by a fixture 506, with the first flange portion 103 supporting the first case 110, the second power semiconductor module 2 and the third power semiconductor module 3. Here, the flow path-forming body 502 functions as a fixing member.

Consequently, the first power semiconductor module 1, the second power semiconductor module 2 and the third power semiconductor module 3 are housed in the flow path 507 as a result of blocking of the opening 503 by the first flange 103.

As illustrated in FIG. 14, the flow path 507 is formed such that a flow path space 508 is provided at a position opposed to the flow path space 500 with the second power semiconductor module 2 provided therebetween. This enables cooling of the second power semiconductor module 2 from both sides, from the flow path space 500 and the flow path space 508, and enables direct cooling of the outer sides of the first case 110 and the second case 210, so that cooling performance can be improved.

In other words, according to the present embodiment, since there is no need of attaching at least two of first power semiconductor module 1 and the second power semiconductor module 2 separately to the flow path-forming body 502 while having watertightness, sealing between the power semiconductor module and the flow path-forming body 502 can be realized at a reduced number of one place from two places, thereby promoting size-reduction.

Additionally, since on a flange surface of the first flange portion 103 of the first power semiconductor module 1, another power semiconductor module is attached from the side of the flow path, a thickness of a wall portion of the flow path-forming body 502 can be also used as a part of a width of the sealing. Thus arranging the semiconductor modules in parallel while ensuring watertightness and then arranging the power semiconductor modules to be adjacent with each other enables reduction in a mounting area when mounting a plurality of power semiconductor modules.

Additionally, as shown in FIG. 14, the flow path 507 is formed such that a flow path space 509 is provided at a position opposed to the flow path space 501 with the third power semiconductor module 3 provided therebetween. This enables cooling of the third power semiconductor module 3 from both sides, from the flow path space 501 and the flow path space 509, and enables direct cooling of the outer sides of the first case 110 and the third case 310, so that cooling performance can be improved.

Additionally, heat generated from the IGBT 401 and the diode 402 of the semiconductor unit 400 conducts in order from the conductor portions 403 to 406, the insulation members 408 and 409, the fin base portion 112 and the like and is dissipated from the fin 101 or the like. In order to improve heat dissipation efficiency, a coolant is prevented from flowing to a part whose cooling is not required and is made to flow through such a fin-forming region as the fin 101. Thus, the flow path 507 has recessed portions 510 to 512 provided at a bottom thereof. Specifically, the recessed portion 510 is formed to house side surfaces and a bottom surface of the first case 110 on which neither the fin 101 nor the fin 102 is formed. The recessed portion 511 is formed to house side surfaces and a bottom surface of the second case 210 on which neither the fin 201 nor the fin 202 is formed. The recessed portion 512 is formed to house side surfaces and a bottom surface of the third case 310 on which neither the fin 301 nor the fin 302 is formed. Since the first power semiconductor module 1 is arranged at a position higher than the other second power semiconductor module 2 and third power semiconductor module 3, a bottom of the recessed portion 510 is formed at a position higher than a bottom of the other recessed portion 511 and a bottom of the other recessed portion 512. Additionally, between the fin 101 and the second flange portion 203, a flow suppressing member 513 formed of rubber or the like that causes no damage to other member is arranged. Additionally, the flow suppressing member 513 is arranged between the fin 201 and the second flange portion 203, between the fin 102 and the third flange portion 303 and between the fin 302 and the third flange portion 303, respectively. This facilitates flow of the coolant to the fin-forming region, thereby improving cooling performance.

Figure 15:
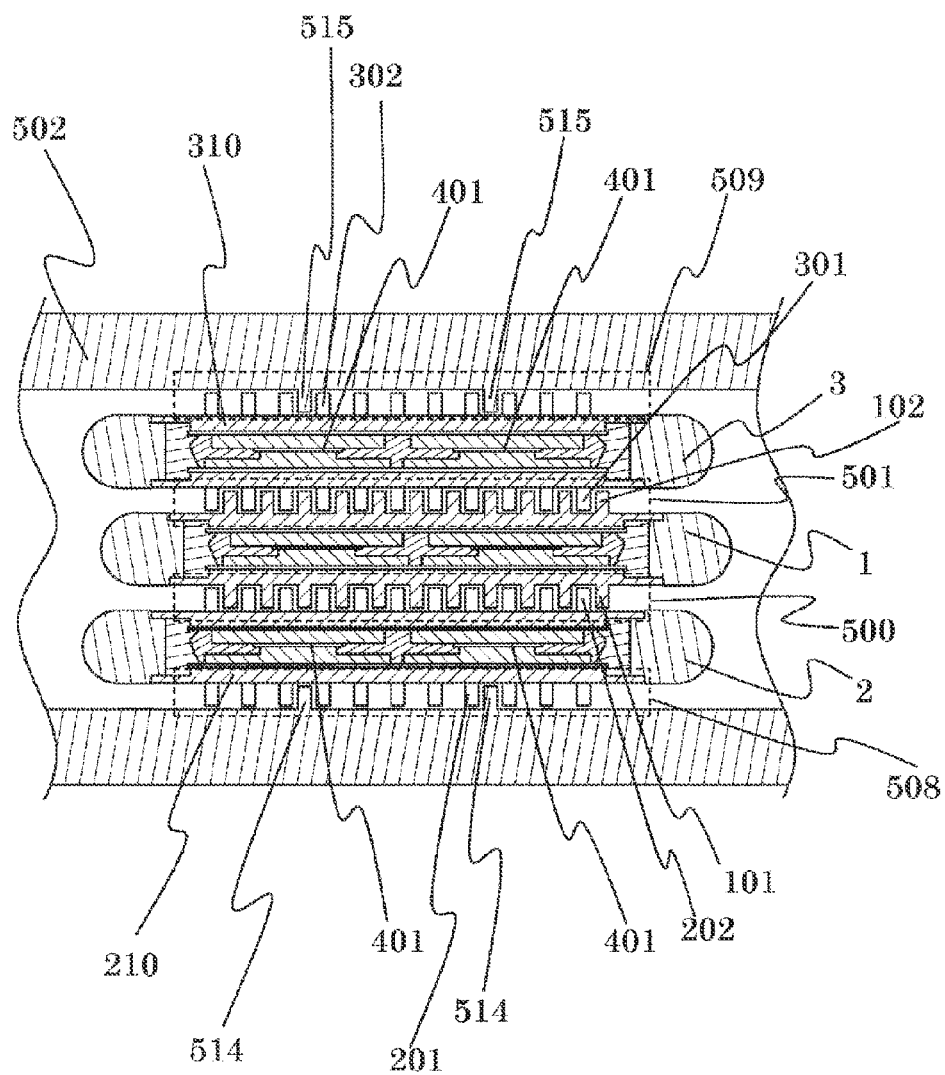
FIG. 15 is a sectional view of a power conversion device according to another embodiment taken along a plane passing through a chain dotted line and seen from a direction of an arrow shown in FIG. 14.

FIG. 15 is a sectional view of a power conversion device according to another embodiment taken along a plane passing through a chain dotted line and seen from a direction of an arrow shown in FIG. 14. The same configuration as that illustrated in the figure numbers of FIGS. 1 to 14 has the same functions and effects. Here, description will be mainly made of parts different from those of the power conversion device illustrated in FIGS. 1 to 14.

Since in a flow path space 500 provided between a first power semiconductor module 1 and a second power semiconductor module 2, a fin 101 and a fin 202 overlap with each other with respect to a coolant flowing direction, a sectional area of the flow path space 500 along the coolant flowing direction will be smaller than a sectional area of a flow path space 508 along the coolant flowing direction. For balancing coolant flow rates in the flow path space 500 and the flow path space 508, a flow path-forming body 502 therefore has, in the flow path space 508, a protrusion portion 514 protruding toward a second case 210. This enables improvement in cooling performance of the second power semiconductor module 2, while contributing to size reduction of the power conversion device.

Additionally, the protrusion portion 514 is arranged such that, when projected from a direction P perpendicular to an electrode surface of a power semiconductor device 401, a projected part of the protrusion portion 514 overlaps with a projected part of the power semiconductor device 401. This increases a flow velocity of the coolant in the vicinity of the power semiconductor device 401 as a heating element, thereby improving heat dissipation performance.

A protrusion portion 515 provided on the side of a flow path space 509 also has the same functions and effects as described above.

Figure 16:
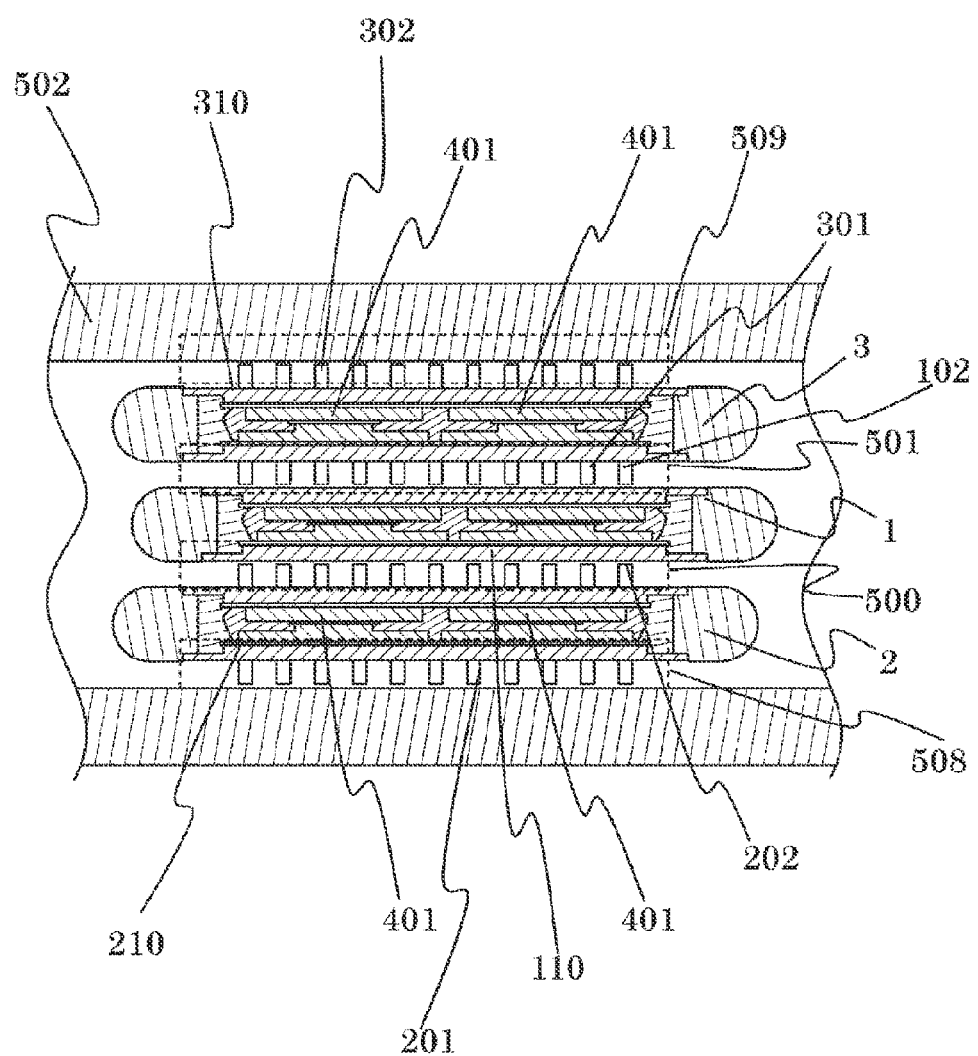
FIG. 16 is a sectional view of a power conversion device according to a further embodiment taken along the plane passing through the chain dotted line and seen from the direction of the arrow shown in FIG. 14.

FIG. 16 is a sectional view of a power conversion device according to a further embodiment taken along the plane passing through the chain dotted line and seen from the direction of the arrow shown in FIG. 14. The same configuration as that illustrated in the figure numbers of FIGS. 1 to 14 has the same functions and effects. Here, description will be mainly made of parts different from those of the power conversion device illustrated in FIGS. 1 to 14.

A second case 210 has a fin 202 arranged in a flow path space 500 and a fin 201 arranged in a flow path space 508. On the other hand, a first case 110 has no fin formed in the flow path space 500. As a result, flow rates of the coolants flowing through the flow path space 500 and the flow path space 508 are balanced to ensure heat dissipation with less variation in each power semiconductor module. Additionally, the fin 202 of a second power semiconductor module 2 is formed to have its distal end portion protruding toward the first case 110 of a first power semiconductor module 1, so that a flow path between the distal end portion of the fin 202 and the first case 110 is narrowed down to increase a flow velocity of the coolant, resulting in reducing effects on heat dissipation which are caused by a reduction in a heat dissipation surface area.

Similarly, a third case 310 has a fin 301 arranged in a flow path space 501 and a fin 302 arranged in a flow path space 509. On the other hand, the first case 110 has no fin formed in the flow path space 501. As a result, the same functions and effects as described above are produced.

As a structure that has the same functions and effects as described above, the first case 110 may have a fin 2 arranged in the flow path space 500 and a fin arranged in the flow path space 501, while the second case 210 may have no fin formed in the flow path space 500 and the third case 310 may have no fin formed in the flow path space 501.

Figure 17:
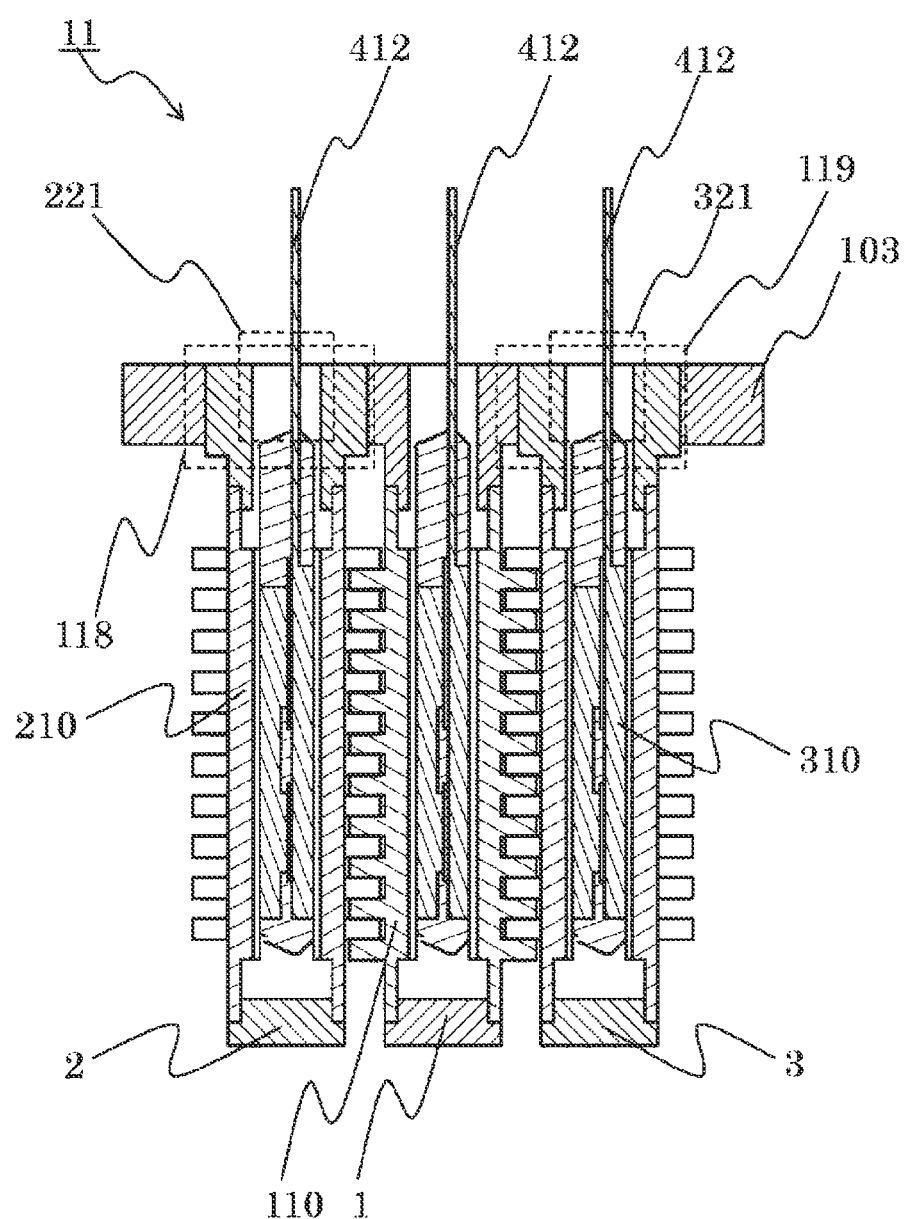
FIG. 17 is a sectional view showing a state where an assembly 11 is incorporated into a flow path-forming body 502 according to a still further embodiment.

FIG. 17 is a sectional view showing a state where an assembly 11 is incorporated into a flow path-forming body 502 according to a still further embodiment. The same configuration as that illustrated in the figure numbers of FIGS. 1 to 14 has the same functions and effects. Here, description will be mainly made of parts different from those of the power conversion device illustrated in FIGS. 1 to 14.

A second case 210 has an opening portion 221 formed for making a positive electrode direct-current terminal 412 or the like protrude outside the second case 210 and a third case 310 has an opening portion 321 formed for making the positive electrode direct-current terminal 412 or the like protrude outside the third case 310. Then, a first flange portion 103 has a through hole 118 formed in which a part forming the opening portion 221 of the second case 210 is fit and has a through hole 119 in which a part forming the opening portion 321 of the third case 310 is fit. As a result, the positive electrode direct-current terminal 412 or the like protrudes to a side opposite to a side on which a second power semiconductor module 2 and a third power semiconductor module 3 are arranged, with the through hole 118 and the through hole 119 provided therebetween. Therefore, a terminal of the second power semiconductor module 2 and a terminal of the third power semiconductor module 3 can suppress an interference with the first flange portion 103, thereby improving insulation reliability and assemblability. Additionally, a tip of the terminal of each of a first power semiconductor module 1, the second power semiconductor module 2 and the third power semiconductor module 3 can be uniform in height, and a position of a bottom surface of the terminal of each of the first power semiconductor module 1, the second power semiconductor module 2 and the third power semiconductor module 3 can be uniform, so that size reduction and assemblability can be improved. The first flange portion 103 and the second case 210 are connected by such a bonding method by which watertightness is obtained and which invites little thermal deformation as laser welding.

Figure 18:
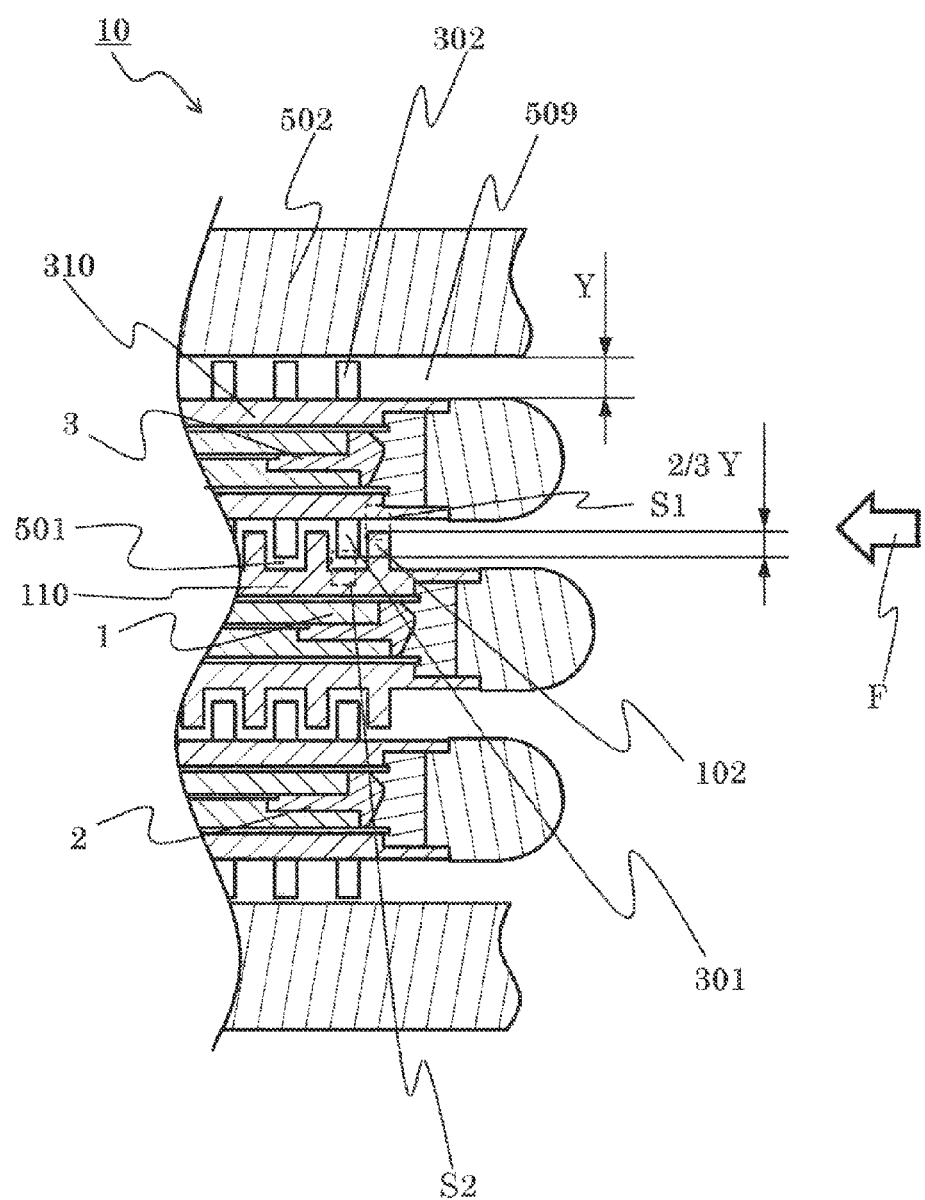
FIG. 18 is a sectional view of a power conversion device according to a still further embodiment.

FIG. 18 is a sectional view of a power conversion device according to a still further embodiment. A fin 102 and a fin 301 which are arranged between a first case 110 of a first power semiconductor module 1 and a third case 310 of a third power semiconductor module 3 partly overlap with each other in an axis direction (a fin protrusion direction). In other words, the fin 102 and the fin 301 overlap with each other when seen from a coolant flowing direction F.

When assuming a length between the third case 310 and a flow path-forming body 502 to be Y, a length of overlap between the fin 102 and the fin 301 is assumed to be about ⅔Y. Here, a fin 302 is assumed to be substantially the same as the length Y. Then, the fin 102, the fin 301 and the fin 302 have the same length.

With such a configuration, the fin 102 and the fin 301 of the first power semiconductor module 1 and the third power semiconductor module 3, respectively, each have a gap of ⅓Y with respect to the other power semiconductor module. As a result, since non-overlapping parts of a flow path are two, S1 and S2, a total of ⅔ of the sectional area of the flow path can be ensured for a flow path space 509. Additionally, although a length of overlap between the fin 102 and the fin 301 is ⅔ of the total fin length Y, because a fin density of a flow path space 501 will be twice as large as a fin density of the flow path space 509, the sectional area of the flow path will be half, which is equivalent to ⅓. Therefore, the flow path space 501 and the flow path space 509 will be the same in a sectional area of the flow path, enabling a coolant to flow in well balance to ensure heat dissipation with less variation.

REFERENCE SIGNS LIST

1 . . . first power semiconductor module, 2 . . . second power semiconductor module, 3 . . . third power semiconductor module, 10 . . . assembly 101 . . . fin, 102 . . . fin, 103 . . . first flange portion, 104a . . . through hole, 104b . . . through hole, 106 . . . through hole, 107 . . . through hole, 108a . . . through hole, 108b . . . through hole, 110 . . . first case, 111 . . . frame body, 112 . . . fin base portion, 113 . . . fin base portion, 114 . . . distal end portion, 115 . . . connection portion, 116 . . . first line fin group, 117 . . . second line fin group, 118 . . . through hole, 119 . . . through hole, 201 . . . fin, 202 . . . fin, 203 . . . second flange portion, 204a . . . connection portion, 204b . . . connection portion, 205 . . . groove, 206 . . . sealing member, 210 . . . second case, 211 . . . frame body, 212 . . . fin base portion, 213 . . . fin base portion, 214 . . . distal end portion, 215 . . . connection portion, 221 . . . opening portion, 301 . . . fin, 302 . . . fin, 303 . . . third flange portion, 304a . . . connection portion, 304b . . . connection portion, 305 . . . groove, 306 . . . sealing member, 310 . . . third case, 311 . . . frame body, 312 . . . fin base portion, 313 . . . fin base portion, 321 . . . opening portion, 400 . . . semiconductor unit, 401 . . . IGBT, 402 . . . diode, 403 . . . conductor portion, 404 . . . conductor portion, 405 . . . conductor portion, 406 . . . conductor portion, 407 . . . sealing resin, 408 . . . insulation member, 409 . . . insulation member, 410 . . . outer circumference portion, 411 . . . insulating resin material, 412 . . . positive electrode direct-current terminal, 413 . . . negative electrode direct-current terminal, 415 . . . alternating-current terminal, 416 . . . upper arm side gate terminal, 417 . . . lower arm side gate terminal, 418 . . . temperature signal terminal, 500 . . . flow path space, 501 . . . flow path space, 502 . . . flow path-forming body, 503 . . . opening, 504 . . . groove, 505 . . . sealing member, 506 . . . fixture, 507 . . . flow path, 508 . . . flow path space, 509 . . . flow path space, 510 . . . recessed portion, 511 . . . recessed portion, 512 . . . recessed portion, 513 . . . flow suppressing member, 514 . . . protrusion portion, 515 . . . protrusion portion, D . . . distance between adjacent fins forming first line fin group 116, F . . . coolant flowing direction, L . . . distance between second line fin group 117 and first line fin group 116

The invention claimed is:

1. A power conversion device comprising:
a first power semiconductor module;
a second power semiconductor module; and
a fixing member which fixes the first power semiconductor module, wherein
the first power semiconductor module has a first power semiconductor device, a first case which houses the first power semiconductor device, and a first flange portion fixed to and in contact with the first case,
the second power semiconductor module has a second power semiconductor device, and a second case which houses the second power semiconductor device,
the second case is fixed to and in contact with the first flange portion so as to provide a first flow path space for allowing a coolant to flow between the second case and the first case,
the first flange portion is fixed to the fixing member while supporting the first case and the second power semiconductor module,
the first case has a first fin, and a first fin base connected to the first fin,
the second case has a second fin, and a second fin base connected to the second fin,
the first fin is formed, in the first flow path space, to have a distal end portion located closer to the second fin base than a connection portion between the first fin and the first fin base, and the second fin is formed, in the first flow path space, to have a distal end portion located closer to the first fin base than a connection portion between the second fin and the second fin base.

2. The power conversion device according to claim 1, comprising:
a third power semiconductor module having a third power semiconductor device and a third case which houses the third power semiconductor device, wherein
the third case is arranged to be opposed to the second case with the first case provided therebetween,
the third case is further fixed to and in contact with the first flange portion so as to provide a second flow path space for allowing the coolant to flow between the third case and the first case, and
the first flange portion is fixed to the fixing member while supporting the first case and the third power semiconductor module.

3. The power conversion device according to claim 1, wherein
the fixing member is a flow path-forming body which forms a flow path for allowing the coolant to flow,
the flow path-forming body forms an opening connecting to the flow path,
the first power semiconductor module and the second power semiconductor module are housed in the flow path as a result of blocking of the opening by the first flange, and
the flow path is formed so as to provide a second flow path space at a position opposed to the first flow path space with the second power semiconductor module provided therebetween.

4. The power conversion device according to claim 1, wherein
the second power semiconductor module has a terminal for allowing current to flow or transmitting a control signal to the second power semiconductor device,
the second case forms an opening portion from which the terminal protrudes outside the second case,
the first flange portion forms a through hole through which the terminal passes, and
an insulating resin material is arranged between an internal wall of the through hole and the terminal.

5. The power conversion device according to claim 1, wherein
the first fin is configured to include a first line fin group aligned in a direction traversing a coolant flowing direction,
the second fin is formed to have a width opposed to the coolant flowing direction larger than a distance between adjacent fins forming the first line fin group, and
when projected from the coolant flowing direction, the second fin is arranged such that a projected part of the second fin overlaps a space between the adjacent fins forming the first line fin group.

6. The power conversion device according to claim 5, wherein
the first fin is configured to include a second line fin group aligned in a direction traversing the coolant flowing direction,
the second line fin group is arranged such that a distance between the second line fin group and the first line fin group in the coolant flowing direction is larger than a width of the second fin along the coolant flowing direction, and an insertion direction of the second case for a connection to the first flange portion traverses the coolant flowing direction.

7. The power conversion device according to claim 1, wherein
the second power semiconductor module has a terminal for allowing current to flow or transmitting a control signal to the second power semiconductor device,
the second case forms an opening portion from which the terminal protrudes outside the second case,
the first flange portion forms a through hole in which a part forming the opening portion of the second case fits, and
the terminal protrudes to a side opposite to a side on which the second power semiconductor module is arranged, with the through hole provided therebetween.

8. A power conversion device comprising:
a first power semiconductor module;
a second power semiconductor module; and
a fixing member which fixes the first power semiconductor module, wherein
the first power semiconductor module has a first power semiconductor device, a first case which houses the first power semiconductor device, and a first flange portion fixed to and in contact with the first case,
the second power semiconductor module has a second power semiconductor device, and a second case which houses the second power semiconductor device,
the second case is fixed to and in contact with the first flange portion so as to provide a first flow path space for allowing a coolant to flow between the second case and the first case,
the first flange portion is fixed to the fixing member while supporting the first case and the second power semiconductor module,
the fixing member is a flow path-forming body which forms a flow path for allowing the coolant to flow,
the flow path-forming body forms an opening connecting to the flow path,
the first power semiconductor module and the second power semiconductor module are housed in the flow path as a result of blocking of the opening by the first flange,
the flow path is formed so as to provide a second flow path space at a position opposed to the first flow path space with the second power semiconductor module provided therebetween,
the first case has a first fin arranged in the first flow path space,
the second case has a first portion of a plurality of second fins arranged separately in the first flow path space and a second portion of the plurality of second fins arranged in the second flow path space, and
the flow path-forming body has a protrusion portion protruding, in the second flow path space, toward the second case.

9. The power conversion device according to claim 8, wherein the protrusion portion is arranged such that when projected from a direction perpendicular to an electrode surface of the second power semiconductor device, a projected part of the protrusion portion overlaps with a projected part of the second power semiconductor device.

10. A power conversion device comprising:
a first power semiconductor module;
a second power semiconductor module; and
a fixing member which fixes the first power semiconductor module, wherein the first power semiconductor module has a first power semiconductor device, a first case which houses the first power semiconductor device, and a first flange portion fixed to and in contact with the first case, the second power semiconductor module has a second power semiconductor device, and a second case which houses the second power semiconductor device, the second case is fixed to and in contact with the first flange portion so as to provide a first flow path space for allowing a coolant to flow between the second case and the first case, the first flange portion is fixed to the fixing member while supporting the first case and the second power semiconductor module, the fixing member is a flow path-forming body which forms a flow path for allowing the coolant to flow, the flow path-forming body forms an opening connecting to the flow path, the first power semiconductor module and the second power semiconductor module are housed in the flow path as a result of blocking of the opening by the first flange, the flow path is formed so as to provide a second flow path space at a position opposed to the first flow path space with the second power semiconductor module provided therebetween, the second case has a first portion of a plurality of second fins arranged separately in the first flow path space and a second portion of the plurality of second fins arranged in the second flow path space, and the first case has no fin formed in the first flow path space.

11. The power conversion device according to claim 10, comprising:
a third power semiconductor module having a third power semiconductor device and a third case which houses the third power semiconductor device, wherein the third case is arranged to be opposed to the second case with the first case provided therebetween, the third case is further connected to the first flange portion so as to provide a third flow path space for allowing the coolant to flow between the third case and the first case, the first flange portion is fixed to the flow path-forming body while supporting the first case and the third power semiconductor module, the flow path is formed so as to provide a fourth flow path space at a position opposed to the third flow path space with the third power semiconductor module provided therebetween, the third case has a first portion of a plurality of third fins arranged in the third flow path space and a second portion of the plurality of third fins arranged in the fourth flow path space, and the first case has no fin formed in the third flow path space.

12. A power conversion device comprising:
a first power semiconductor module;
a second power semiconductor module; and
a fixing member which fixes the first power semiconductor module, wherein the first power semiconductor module has a first power semiconductor device, a first case which houses the first power semiconductor device, and a first flange portion fixed to and in contact with the first case, the second power semiconductor module has a second power semiconductor device, and a second case which houses the second power semiconductor device, the second case is fixed to and in contact with the first flange portion so as to provide a first flow path space for allowing a coolant to flow between the second case and the first case, the first flange portion is fixed to the fixing member while supporting the first case and the second power semiconductor module, the fixing member is a flow path-forming body which forms a flow path for allowing the coolant to flow, the flow path-forming body forms an opening connecting to the flow path, the first power semiconductor module and the second power semiconductor module are housed in the flow path as a result of blocking of the opening by the first flange, the flow path is formed so as to provide a second flow path space at a position opposed to the first flow path space with the second power semiconductor module provided therebetween, the first case has a first fin arranged in the first flow path space, the second case has a second fin arranged in the second flow path space, and the second case has no fin formed in the first flow path space.

* * * * *